United States Patent [19]
Mizukami et al.

[11] 3,947,645
[45] Mar. 30, 1976

[54] DEMULTIPLEXER FOR FM STEREOPHONIC RECEIVERS

[75] Inventors: Takashi Mizukami; Takuo Mouri, both of Tokyo, Japan

[73] Assignee: Pioneer Electronic Corporation, Tokyo, Japan

[22] Filed: Sept. 13, 1974

[21] Appl. No.: 505,817

[30] Foreign Application Priority Data
Sept. 13, 1973 Japan............... 48-107475[U]

[52] U.S. Cl................. 179/15 BT; 330/85
[51] Int. Cl.² ............................. H04H 5/00
[58] Field of Search...... 179/15 BT; 329/50; 330/85

[56] References Cited
UNITED STATES PATENTS

| | | | |
|---|---|---|---|
| 3,089,098 | 5/1963 | Noe | 330/85 |
| 3,204,192 | 8/1965 | Barditch et al. | 330/85 |
| 3,516,002 | 6/1970 | Hillis | 330/85 |
| 3,573,382 | 4/1971 | Feit et al. | 179/15 BT |
| 3,667,055 | 5/1972 | Uchida | 330/85 |
| 3,737,798 | 6/1973 | Paraguet et al. | 330/85 |
| 3,842,211 | 10/1974 | Metro | 179/15 BT |

OTHER PUBLICATIONS
"Electronic Circuits" by Angeleo pp. 603–605 published by McGraw-Hill, Inc. 1958.

*Primary Examiner*—Douglas W. Olms
*Attorney, Agent, or Firm*—Sughrue, Rothwell, Mion & Zinn

[57] ABSTRACT

A balanced demultiplexer for an FM stereophonic receiver includes a differentially connected switching circuit, a differentially connected crosstalk cancellation circuit and a differential amplifier circuit which is connected as a constant current source to the switching and cancellation circuits. The switching signal is applied to both the switching and cancellation circuits but in reverse phase. An input composite signal is applied to the differential amplifier which causes crosstalk components to appear in reverse phase at the outputs of the switching and cancellation circuits. In order to eliminate distortion due to nonlinearities of the input transistor in the differential amplifier, an operational amplifier is connected between the emitter and base circuits of the transistor to provide negative feedback.

3 Claims, 4 Drawing Figures

DEMULTIPLEXER FOR FM STEREOPHONIC RECEIVERS

BACKGROUND OF THE INVENTION

1. Field of the Invention

The present invention relates generally to demultiplexer circuits, and more particularly to an improved, low distortion balanced demultiplexer for FM stereophonic receivers.

2. Description of the Prior Art

In the conventional balanced type demultiplexer circuit to which an input signal is applied via a transistor circuit forming a constant current supplying source, the base bias potential of the transistor is chosen high enough to minimize the signal distortion caused by the use of the transistor with its inherent nonlinear characteristic. However, since the choice of the base bias potential is limited because of the available maximum d-c level of the demultiplexer circuit, it is difficult to obtain the desired minimum distortion.

SUMMARY OF THE INVENTION

The object of the present invention is to minimize the signal distortion developed at the demultiplexer circuit, and also to increase the freedom of the choice of d-c operating point.

BRIEF DESCRIPTION OF THE DRAWINGS

The specific nature of the invention, as well as other objects, aspects, uses and advantages thereof, will clearly appear from the following description and from the accompanying drawings, in which.

DESCRIPTION OF THE PREFERRED EMBODIMENT

Figure 1:
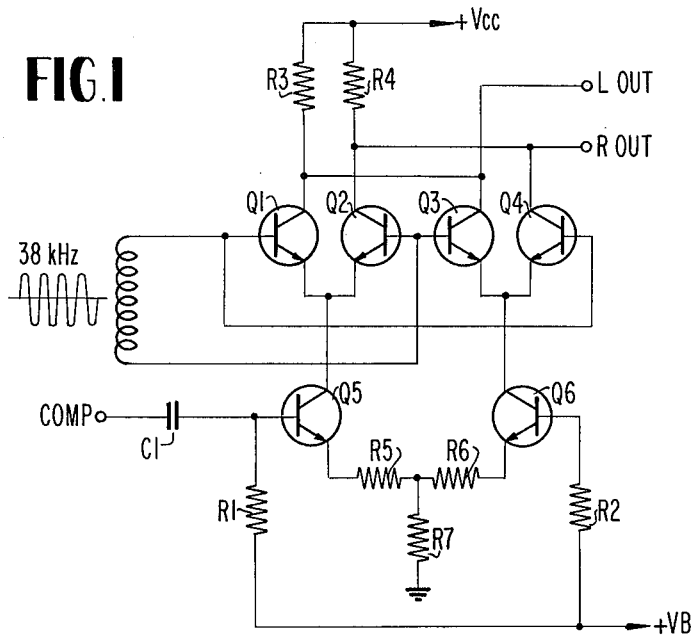
FIG. 1 is a schematic diagram of a conventional balanced demultiplexer circuit.

FIG. 1 shows a conventional balanced FM demultiplexing circuit, and more particularly its linear switching circuit portion. The transistors Q1 and Q2 are differentially connected to each other and form a switching circuit, and the transistors Q3 and Q4 are differentially connected to each other and form a crosstalk cancelling circuit. Further, the switching circuit and the crosstalk cancelling circuit are connected respectively to the transistors Q5 and Q6, which form a constant current source and which are also connected to each other in a differential manner.

To the base electrodes of the transistors Q5 and Q6 are supplied base bias voltages from a base bias source $+V_B$ through resistors R1 and R2, respectively. The base electrode of transistor Q5 is also supplied with a composite signal through a capacitor C1. The base electrodes of the transistors Q1, Q2, Q3, and Q4 are connected to a source of 38 KHz switching signal in such a manner that, for example, a positive half-cycle of the switching signal will put Q1 in a conductive state and Q2 in a non-conductive state. Thus, the collector current of the transistor Q5 can be taken out from the terminal $L_{out}$, where the collector resistance R3 of the transistor Q1 forms part of the load resistance.

The composite signal divided by resistances R5, R6, and R7 is phase inverted at transistor Q6 and fed out from its collector electrode. The crosstalk components included in the signal are cancelled due to the action of transistors Q3 and Q4 which form a crosstalk cancelling circuit. Therefore, the signal appearing at terminal $L_{out}$ is improved in separation. The R(right) signal can be taken out as the terminal $R_{out}$ in the same way as the L(left) signal mentioned above.

In order to better understand the operation of the circuit shown in FIG. 1, consider first the operation only of the switching circuit comprising Q1, Q2 and Q5. On the positive half-cycle of the 38 KHz subcarrier, Q1 is on and Q2 is off, while on the negative half-cycle of the subcarrier, Q2 is on and Q1 is off. By "on" and "off", what is meant is maximum and minimum collector current. When Q1 is on, the collector potential of Q5 is taken at terminal $L_{out}$ as described above. In other words, since the composite signal is being applied to the base of Q5, switching operation is performed if the subcarrier and the composite signal are in phase. There is, however, a crosstalk component that appears at terminal $R_{out}$ as well. This is because an idle current flows in the "off" state of Q2 since the operation of Q1 and Q2 is not Class B. Accordingly, a part of the collector potential of Q5 appears at the collector of Q2. Such a component is crosstalk and appears in phase with a signal appearing at $L_{out}$. Simultaneously, a subcarrier component of 38 KHz is present also; however, the subcarrier component at $L_{out}$ is of opposite phase to that of $R_{out}$, since when Q1 is on and Q2 is off, the collector potentials are opposite to one another.

The appearance of these components of the output terminals $L_{out}$ and $R_{out}$ causes deterioration of channel separation, beat frequencies, noise and the like, so that it is necessary to eliminate such components. This is achieved with the cancelling circuit comprising Q3, Q4 and Q5.

For crosstalk cancellation, the composite signal applied to the base of Q5 is generated at the collector side in reverse phase. At the same time, the composite signal appearing at the emitter of Q5 is in phase with the input signal at the base, and this signal is applied to the emitter of Q6 after being divided by R5, R6 and R7. The signal of the collector of Q6 is in phase with the input signal at the emitter of Q6 since Q6 constitutes a grounded base amplifier. Thus, the collector signals of Q5 and Q6 are of reverse phase.

When Q1 is on, Q4 is on at the same time. Therefore, the crosstalk component generated at the collector of Q2 is in reverse phase with the signal generated at the collector of Q4. Since the collector of Q2 is connected to the collector of Q4, these components are cancelled if they are of the same level. This can be accomplished by making the attenuator comprising R5, R6 and R7 adjustable. For example, R7 could be a variable resistor, adjustment of which would improve separation by causing the level of the cancellation signal at the collector of Q4 to be exactly the same as the level of the crosstalk signal at the collector of Q2.

Subcarrier cancellation is performed by Q3 and Q4. Since the bases of Q1 and Q4 and the bases of Q2 and Q3 are connected, the subcarrier component generated at the collector of Q1 is in reverse phase with the subcarrier component generated at the collector of Q3. The same relation holds for Q2 and Q4. Therefore, since the collectors of Q1 and Q3 and the collectors of Q2 and Q4 are connected, the subcarrier components are cancelled.

Figure 2:
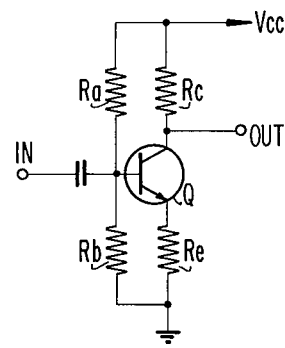
FIG. 2 is a schematic diagram of a typical transistor voltage amplifier circuit.
Figure 3:
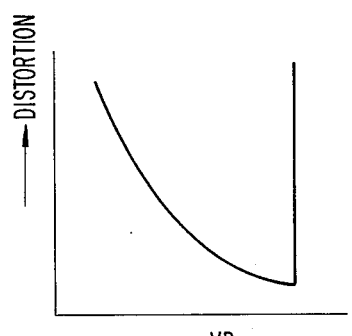
FIG. 3 is a graph of the characteristic distortion curve of the amplifier circuit shown in FIG. 2.

Considering the transistor Q5 to which above said composite signal is applied, it is well known that the signal distortion in the circuit can be reduced by applying a high potential to the base circuit. Take, for example, the voltage amplifier circuit shown in FIG. 2 for simplifying the explanation of the present circuit. The relationship between the bias voltage and the distortion may be illustrated by the characteristic curve in FIG. 3, where the base bias voltage $V_B$ of the transistor Q is plotted in the horizontal direction and the distortion in the vertical direction.

As shown in this figure, if the voltage $V_B$ is chosen high, the distortion will be small. However, when the voltage $V_B$ exceeds a certain limit or critical point, the distortion will increase rapidly. To move this critical point to a higher value of $V_B$, the voltage $V_{cc}$ applied to the circuit must be chosen high. The choice of high $R_c$ and $V_{cc}$ may also decrease distortion. The choice of these factors is, however, restricted when the device is constructed as an integrated circuit. This is particularly true of the transistor Q5 of the demultiplexer circuit of FIG. 1.

Figure 4:
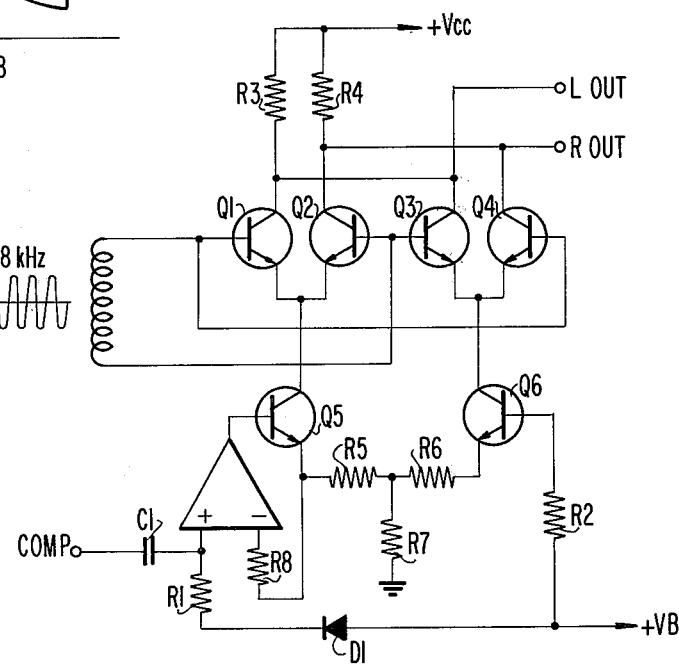
FIG. 4 is a schematic diagram of the improved balanced demultiplexer circuit according to the present invention.

Such an inconvenience is solved in the improved circuit shown in FIG. 4 where corresponding parts as those in FIG. 1 are designated by the same symbols. More specifically, a feedback amplifier is connected between the emitter and the base circuit of transistor Q5, and the input signal for this improved circuit is applied to the input of the feedback amplifier, whereby the distortion developed at transistor Q5 is reduced by the negative feedback. The improved circuit of FIG. 4 is provided with a high-gain operational amplifier A comprising an output terminal connected to the base of transistor Q5, a negative input terminal connected to the emitter of transistor Q5 through resistor R8, and a positive input terminal to be supplied with the input composite signal, whereby the amplifier acts as a voltage follower.

In accordance with the present invention as described hereinbefore, the amount of distortion included in the output signal can be made very small over a wide range of variation of the base bias voltage because the operational amplifier is connected to the transistor Q5 of the constant current source in such manner as to include transistor Q5 in the negative feedback loop of the amplifier. The improved circuit in accordance with the present invention may be effectively used to obtain an FM stereophonic demultiplexer with less distortion, particularly when it is applied to an integrated circuit. Moreover, in FIG. 4, diode D1 produces a voltage-drop corresponding to base-emitter voltage $V_{BE}$ of transistor Q5. This diode is inserted to balance the direct currents applied to two input terminals of the operational amplifier A.

Accordingly, it will be appreciated that even if distortion is generated in transistor Q5, that distortion will be cancelled by the negative feedback of the operational amplifier A. Consequently, a nondistorted signal current flows in the collector of Q5.

It will be apparent, however, that the embodiment shown is only exemplary and that various modifications can be made in construction and arrangement within the scope of the invention.

We claim:

1. In a balanced demultiplexer circuit for use in FM stereophonic receivers including a differentially connected switching circuit connected to a source of switching signal and a transistor amplifier connected as a constant current source to said switching circuit, said transistor amplifier having a base circuit and an emitter circuit, said base circuit being adapted to receive an input composite signal, the improvement comprising feedback means connected between said emitter circuit and said base circuit for providing negative feedback to the input of said transistor amplifier whereby the distortion developed by said transistor amplifier is reduced.

2. The improvement as recited in claim 1 wherein said feedback means is an operational amplifier having positive and negative input terminals and an output terminal, said positive input terminal being connected to receive said input composite signal, said negative input terminal being connected to said emitter circuit, and said output terminal being connected to said base circuit.

3. The improvement as recited in claim 2 further comprising a source of base bias voltage and a diode connected in series to said positive input terminal, said diode providing a voltage drop corresponding to the base-emitter voltage of said transistor amplifier.

* * * * *